United States Patent
Fitzsimmons et al.

(10) Patent No.: US 9,070,625 B2
(45) Date of Patent: Jun. 30, 2015

(54) SELECTIVE ETCH CHEMISTRY FOR GATE ELECTRODE MATERIALS

(71) Applicant: International Business Machines Corporation, Armonk, NY (US)

(72) Inventors: John A. Fitzsimmons, Poughkeepsie, NY (US); David L. Rath, Stormville, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 13/828,650

(22) Filed: Mar. 14, 2013

(65) Prior Publication Data

US 2013/0203231 A1     Aug. 8, 2013

Related U.S. Application Data

(63) Continuation-in-part of application No. 13/343,190, filed on Jan. 4, 2012, now Pat. No. 8,835,326.

(51) Int. Cl.
| | |
|---|---|
| *H01L 21/283* | (2006.01) |
| *H01L 21/8238* | (2006.01) |
| *H01L 21/3213* | (2006.01) |
| *C23F 1/02* | (2006.01) |
| *C23F 1/32* | (2006.01) |
| *C23G 1/20* | (2006.01) |

(52) U.S. Cl.
CPC ...... *H01L 21/283* (2013.01); *H01L 21/823842* (2013.01); *H01L 21/32134* (2013.01); *C23F 1/02* (2013.01); *C23F 1/32* (2013.01); *C23G 1/205* (2013.01)

(58) Field of Classification Search
CPC .............. H01L 21/32134; H01L 21/823842; H01L 21/283; C23G 1/205; C23F 1/02; C23F 1/32
USPC .......................................... 438/299, 585, 592
See application file for complete search history.

(56) References Cited

U.S. PATENT DOCUMENTS

| | | | |
|---|---|---|---|
| 4,804,636 A | 2/1989 | Groover, III et al. | |
| 6,200,910 B1 | 3/2001 | O'Brien et al. | |

(Continued)

OTHER PUBLICATIONS

Chen, et al., "64 nm pitch Cu Dual-Damascene Interconnects using Pitch Split Double Exposure Patterning Scheme", IEEE International Interconnect Technology Conference (IITC), May 8-12, 2011, Session 8.3, 3 pages.

(Continued)

*Primary Examiner* — Nadine Norton
*Assistant Examiner* — Mahmoud Dahimene
(74) *Attorney, Agent, or Firm* — Scully, Scott, Murphy & Presser, P.C.

(57) ABSTRACT

A chemical solution including an aqueous solution, an oxidizing agent, and a pH stabilizer selected from quaternary ammonium salts and quaternary ammonium alkali can be employed to remove metallic materials in cavities for forming a semiconductor device. For example, metallic materials in gate cavities for forming a replacement gate structure can be removed by the chemical solution of the present disclosure with, or without, selectivity among multiple metallic materials such as work function materials. The chemical solution of the present disclosure provides different selectivity among metallic materials than known etchants in the art.

19 Claims, 9 Drawing Sheets

(56) References Cited

U.S. PATENT DOCUMENTS

| | | |
|---|---|---|
| 6,379,577 B2 | 4/2002 | Akatsu et al. |
| 6,686,275 B2 | 2/2004 | Chen et al. |
| 6,797,682 B2 | 9/2004 | Hara et al. |
| 7,396,768 B2 | 7/2008 | Feng et al. |
| 7,671,001 B2 | 3/2010 | Skee |
| 7,922,824 B2 | 4/2011 | Minsek et al. |
| 7,947,637 B2 | 5/2011 | Kneer |
| 8,080,475 B2 | 12/2011 | RamachandraRao et al. |
| 2006/0027924 A1 | 2/2006 | Chen et al. |
| 2006/0117667 A1 | 6/2006 | Siddiqui et al. |
| 2006/0226122 A1 | 10/2006 | Wojtczak et al. |
| 2009/0082240 A1* | 3/2009 | Nukui et al. ............ 510/176 |
| 2009/0120457 A1* | 5/2009 | Naghshineh et al. ........ 134/2 |
| 2009/0301996 A1 | 12/2009 | Visintin et al. |
| 2010/0105205 A1 | 4/2010 | Lee et al. |
| 2012/0133044 A1* | 5/2012 | Uozumi ................. 257/751 |

OTHER PUBLICATIONS

Lee, et al., "Crystallographic Structures and Parasitic Resistances of Self-Aligned Silicide TiSi2/Self-Aligned Nitrided Barrier Layer/Selective Chemical Vapor Deposited Aluminum in Fully self-Aligned Metallization Metal Oxide Semiconductor Field Effect Transistor", Jpn. J. Appl. Phys., vol. 38, 1999, pp. 5835-5838.

Cheng, et al., "Formation of C54-TiSi2 in titanium on nitrogen-ion-implanted (001) Si with a thin interposing Mo layer", J. Mater. Res., vol. 14, No. 5, May 1999, pp. 2061-2069.

Fitzsimmons, et al., "Titanium-Nitride Removal", U.S. Appl. No. 13/343,190, filed Jan. 4, 2012.

Office Action dated Nov. 13, 2013 received in a related U.S. Patent Application, namely U.S. Appl. No. 13/343,190.

Office Action dated Jan. 30, 2015 received in a related U.S. Patent Application, namely U.S. Appl. No. 13/828,249.

\* cited by examiner

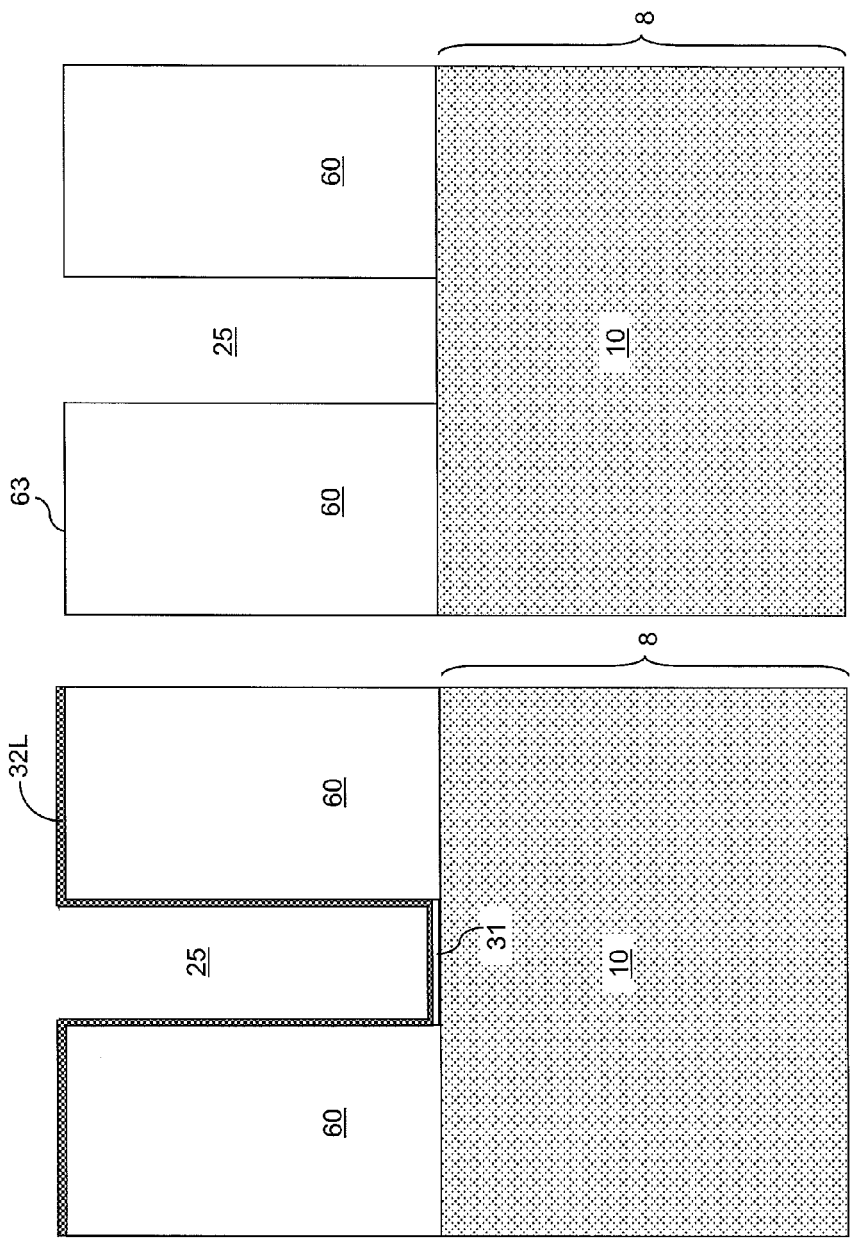

US 9,070,625 B2

SELECTIVE ETCH CHEMISTRY FOR GATE ELECTRODE MATERIALS

RELATED APPLICATIONS

This application is a continuation-in-part of U.S. patent application Ser. No. 13/343,190 filed on Jan. 4, 2012, the content and disclosure of which are incorporated herein by reference.

BACKGROUND

The present disclosure relates to a method of removing a metallic material from a cavity of a microelectronic device. More particularly, the present disclosure relates to a method of removing a metallic material employing a chemical solution including an aqueous solution, an oxidizing agent, and a pH stabilizer selected from at least one quaternary ammonium salt or at least one quaternary ammonium alkali.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 2 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. A challenge in semiconductor technology has been to provide two types of gate electrodes having a first work function at or near the valence band edge and a second work function at or near the conduction band edge of the underlying semiconductor material such as silicon. This challenge has been particularly difficult because the two types of gate electrodes are also required to be a metallic material having a high electrical conductivity.

In order to provide two types of gate electrodes, portions of a conductive material are removed from one type of gate electrodes while other portions of the conductive material remain in another type of gate electrodes. Removal of such a conductive material needs be performed in a controllable manner. In some cases, removal of a conductive material needs to be performed selective to another conductive material. While the etch chemistry of SC1 etch, which employs a combination of ammonium hydroxide and hydrogen peroxide, is known to etch metallic materials, the etch rate of the SC1 etch is generally high for most metallic materials, and provides insufficient etch selectivity among various metallic materials.

Thus, an etch chemistry that can provide additional selectivity or non-selectivity among metallic materials to overcome the limitations of the SC1 etch is desired.

SUMMARY

A chemical solution including an aqueous solution, an oxidizing agent, and a pH stabilizer selected from at least one quaternary ammonium salt or at least one quaternary ammonium alkali can be employed to remove metallic materials in cavities for forming a semiconductor device. For example, metallic materials in gate cavities for forming a replacement gate structure can be removed by the chemical solution of the present disclosure with, or without, selectivity among multiple metallic materials such as work function materials. The chemical solution of the present disclosure provides different selectivity among metallic materials than known etchants in the art.

According to an aspect of the present disclosure, a method of forming a microelectronic device is provided. At least one cavity is formed in a dielectric material layer over a semiconductor substrate. At least one metallic material is deposited within the at least one cavity. A portion of the at least one metallic material is removed by an etch process employing a chemical composition. The chemical composition includes an aqueous solution, a pH stabilizer selected from at least one quaternary ammonium salt or at least one quaternary ammonium alkali, and an oxidizing agent selected from peroxides and oxidants.

BRIEF DESCRIPTION OF THE SEVERAL VIEWS OF THE DRAWINGS

FIG. 2 is a vertical cross-sectional view of a first exemplary semiconductor structure after formation of a gate cavity according to a first embodiment of the present disclosure.

FIG. 3 is a vertical cross-sectional view of the first exemplary semiconductor structure after formation of an interfacial dielectric layer and a gate dielectric layer according to the first embodiment of the present disclosure.

DETAILED DESCRIPTION

Figure 1:
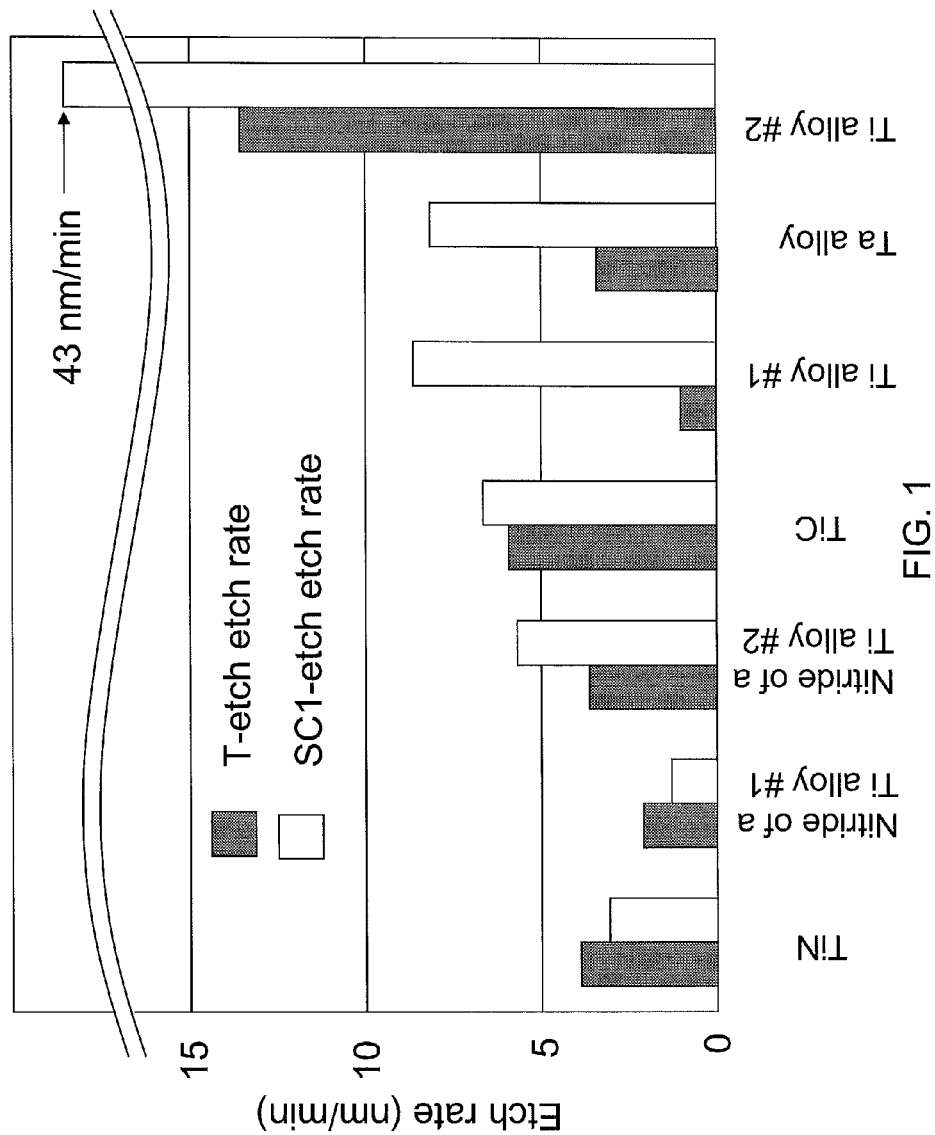
FIG. 1 is a graph comparing etch rates of a chemical composition according to an embodiment of the present disclosure and an SC1 solution.

As stated above, the present disclosure relates to a method of removing a metallic material employing a chemical solution including an aqueous solution, an oxidizing agent, and a pH stabilizer selected from at least one quaternary ammonium salt or at least one quaternary ammonium alkali. Aspects of the present disclosure are now described in detail with accompanying figures. Like and corresponding elements mentioned herein and illustrated in the drawings are referred to by like reference numerals. The drawings are not necessarily drawn to scale. As used herein, ordinals such as "first," "second," and "third" are employed merely to distinguish similar elements, and different ordinals may be employed to designate a same element in the specification and/or claims.

As used herein, a field effect transistor refers to any planar transistor having a gate electrode overlying a horizontal planar channel, any fin field effect transistor having a gate electrode located on sidewalls of a semiconductor fin, or any other types of metal-oxide semiconductor field effect transistor (MOSFETs) and junction field effect transistors (JFETs).

The following describes embodiments of the present disclosure with reference to the drawings. The embodiments are illustrations of the disclosure, which can be embodied in various forms. The present disclosure is not limited to the embodiments described below, rather representative for teaching one skilled in the art how to make and use it. Some aspects of the drawings repeat from one drawing to the next. The aspects retain their same numbering from their first appearance throughout each of the preceding drawings.

The present disclosure provides a chemical solution that removes at least one metallic material selective to, or without selectivity to, at least another metallic material during manufacturing of microelectronic devices such as field effect transistors. The present disclosure provides a method for patterning at least one metallic material in cavities surrounded by a dielectric material layer and located on a semiconductor substrate.

Compositions of the chemical solution may be embodied in a wide variety of specific formulations, as hereinafter more fully described. In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.0001 weight percent, based on the total weight of the composition in which such components are employed.

The chemical compositions of the disclosure may be formulated to remove physically exposed portions of at least one metallic material selective to dielectric materials such as dielectric metal oxides or interlayer dielectric materials employed for metal interconnect structures. The chemical composition may be formulated to remove at least one work function metal such as TiN, TiC, TaN, TaC, a carbide of a titanium alloy, or a carbide of a tantalum alloy, or to remove a contact metal such as W or Al selective or non-selective to at least one work function metal, without substantially damaging the underlying gate dielectric materials or interlayer dielectric materials. The methods of the present disclosure may be employed for devices where there is only one work function metal. An additional advantage of the methods of the present disclosure is manifested where more than one work function metal is present. While the present disclosure is illustrated employing an embodiment in which two work function metals are employed, embodiments are expressly contemplated in which the illustrated methods of the present disclosure are extended to cases where more than two work function metals are employed.

The chemical composition of the present disclosure includes an oxidizing agent and a pH controlling agent in an aqueous solution. De-ionized water is the principle solvent in the aqueous solution. The solvent must be at least free of any detrimental ions or other materials that could interfere with the cleaning action of the chemical composition or degrade the cleanliness or future performance of the semiconductor circuit. While de-ionized water is the most preferred solvent for the chemical composition, it is understood that other solvent systems with similar salvation properties to de-ionized water may also act as a possible solvent for the present disclosure. Thus, an aqueous solution is most preferred. However, it is understood that other solvent systems similar to water may also act suitably for the present disclosure. For example, a 25% isopropanol, 75% de-ionized water solvent system may also produce satisfactory results.

The oxidizing agent is preferably a peroxide, for example hydrogen peroxide and organic peroxides such as benzoyl peroxide. However, oxidizing agents may also include a non-metal with the ability to oxidize titanium nitride (TiN) to a soluble compound without leaving a metallic residue and oxidants that do not leave a residue or adversely attack films intended to remain undamaged. In other words, the oxidant should be able to be controlled such that undesired attack of metal films does not occur. More specifically, the pH may be adjusted such that the etch rate of one work function or contact metal may be adjusted to be selective or non-selective to a work function metal or metals, and/or a surface adsorption action may occur due to agents in the present disclosure such that these metals are protected from uncontrolled oxidation.

The present chemical composition as it is so designed with the understanding that the tetraethylammonium (TEA) ion may act as a passivating adsorbent with respect to a transition metal present in the alloy or a lanthanide metal (for example Ti, Ta, alloys including Ti and carbon, or alloys including Ta and carbon), and as such, provide a modification of the alloy etch behavior (as compared to a etch without this a passivating adsorbent action) at the pH value of operation.

The pH stabilizer adjusts the pH level in the chemical composition to a range of about 7 to about 14. In one embodiment, the amount of the pH stabilizer can be selected such that the pH level of the working solution is adjusted to a range of about 7 to about 10. In another embodiment, the amount of the pH stabilizer can be selected such that the pH level of the working solution is adjusted to a range of about 7 to about 9. In yet another embodiment, the amount of the pH stabilizer can be selected such that the pH level of the working solution is adjusted to a range of about 7 to about 8. In one embodiment, the weight percentage of the pH stabilizer in the working solution can be from 0.14% to 14%. In another embodiment, the weight percentage of the pH stabilizer in the working solution can be not less than 0.28%. In yet another embodiment, the weight percentage of the pH stabilizer in the working solution can be not less than 0.7%. In still another embodiment, the weight percentage of the pH stabilizer in the working solution can be not less than 1.4%. In one embodiment, the weight percentage of the pH stabilizer in the working solution can be not greater than 7%. In one embodiment, the weight percentage of the pH stabilizer in the working solution can be not greater than 2.8%. In one embodiment, the weight percentage of the pH stabilizer in the working solution can be not greater than 1.4%. Quaternary ammonium salts and quaternary ammonium alkalis are preferred for use as a pH stabilizer in the present disclosure Quaternary ammonium salts (and especially quaternary ammonium basic salts or quaternary ammonium salts including at least one quaternary ammonium basic salt) and quaternary ammonium alkalis are preferred for use as a pH stabilizer in the present disclosure. A quaternary ammonium compound is a positively charged ion based on 4 R groups associated with a nitrogen atom having a descriptive structure as illustrated below

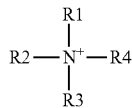

Each of R1, R2, R3, and R4 groups may independently be alkyl or aryl in nature. Each of R1, R2, R3, and R4 group may be identical or different among one another. Thus, a quaternary ammonium compound may be symmetrical or asymmetrical. That is, if an even number of R groups (i.e., R1, R2, R3, and R4 groups) are identical, the quaternary ammonium compound is referred to as symmetrical; and if the number of R groups is odd, the quaternary ammonium compound is referred to as asymmetrical. A quaternary ammonium salt is a compound where a quaternary ammonium ion is associated with a corresponding negatively charged ion to produce a net neutral charge for the overall compound. A quaternary ammonium alkali is a quaternary ammonium salt where the corresponding negatively charged ion is a basic ion, which is commonly a hydroxide ion.

Tetramethylammonium hydroxide (TMAH) is the quaternary ammonium compound that is primarily used in the industry. TMAH is a symmetrical quaternary ammonium compound where all the R groups are identical and consist of methyl groups. However, TMAH is toxic, and causes severe and typically unexpected health problems from exposure. Unlike typical strong bases where an unprotected acute exposure generally results in a caustic burn, TMAH may also introduce a complication of decreased respiratory function. Thus, a quaternary ammonium that does not cause unexpected health side effects is preferable. In the course of the research leading to the present disclosure, it has been determined that tetraethylammonium (TEA) ion does not cause the unexpected health side effects of the tetramethylammonium ion. Thus, tetraethylammonium hydroxide (TEAH) is the most preferred pH stabilizer in the present disclosure. In addition to the ability to adjust pH without the introduction of extraneous undesirable metal ions, such as alkaline earth or alkali metal ions, the TEA ion may also act as a passivating adsorbent on a copper surface at the pH value of the present chemical composition as it is also designed.

The preferred use of TEAH does not preclude the use of other suitable quaternary ammonium hydroxides for use in our solutions. It is believed that any quaternary ammonium hydroxide that may be used to adjust pH in a desired range to be suitable for the purpose of the present disclosure. It is believed that any symmetrical or asymmetrical quaternary ammonium hydroxide that does not introduce a complication of decreased respiratory function is a preferred quaternary ammonium hydroxide. Additionally, if a quaternary ammonium salt can provide some passivation action, such a quaternary ammonium salt is even more preferred. In an illustrative example, one or more of trimethyl-phenyl-ammonium hydroxide, dimethyl-dipropyl-ammonium hydroxide and tetrapropyl ammonium hydroxide can be employed as a pH adjustment agent for the formulation of the present disclosure.

Regardless of whether the passivation action by TEA ions occur, the ability to adjust pH without the introduction of extraneous undesirable metal ions and the decreased hazard of TEAH makes TEAH the most preferred pH stabilizer in one embodiment of the present disclosure. It is understood that other quaternary ammonium salts may also act as pH stabilizing agents with or without the additional passivation action towards a metal or semi-metal surface and as long as the resultant solution does not have a detrimental activity towards a metal or semi-metal surface which can not be mitigated; such a resultant solution is within the purview of the present disclosure The approximate bath life of the chemical composition is in the range of about 18 hrs to about 22 hrs. When the chemical bath drops below 10-15% fresh bath, the bath is no longer useful. It is understood that typical methods used to extend solution bath life such as replenishment of the consumed oxidizer in a recirculated solution may be used to extend usable bath life. Additionally, it is known that trace contamination such as minute amounts of some metal ions may also dramatically decrease bath life. As such, the chemical composition of the present disclosure may be of single use (i.e., dispensed on the wafer for cleaning and sent to drain) or multiple use (i.e., reclaimed after initial processing use and stored for additional use). It is recognized that reclamation may decrease the usable life of a reclaimed chemical bath. The use of a sequestering agent (oxidant stabilizer) in the chemical bath, if employed, can increase the life of the bath during reclamation process use. A sequestering agent may be added to an un-reclaimed chemical composition; this sequestering agent may extend the usable bath life of such a composition beyond that of a solution without the sequestering agent. Through the use of a sequestering agent, the oxidizer concentration may be controlled such that excessive oxidant concentration addition to the chemical composition of the present disclosure is not necessary to compensate for oxidant consumption by undesired decomposition due to contamination, rather than by the normal consumption that occurs during the desired cleaning action of the present chemical composition. Thereby, the sequestering agent optimizes the concentration to further minimize the chemical composition's attack on a metal layer by enabling a minimization of required oxidizer concentration in the present chemical composition.

Sequestering agents that can be used in the present disclosure are amines and amino acids. The preferred sequestering agents are 1,2-cyclohexanediamine-N,N,N',N'-tetraacetic acid (CDTA), ethyenediaminetetraacetic acid (EDTA) and diethylenetriaminopentaacetic acid (DTPA). The preferential use of complex sequestering agents, such as CDTA, versus a simple sequestering agent, such as EDTA, is based on the possibility of degradation of a simple sequestering agent over time and at extended exposure to certain temperatures. However, it is understood that for some methods of application a simple sequestering agent such as EDTA may be suitable. For example, a single use system where heating occurs just before the solution dispenses on a wafer for chemical cleaning.

A metal protectant may be added to the chemical composition. The preferred metal protectants for the present disclosure are hetero-organic inhibitors such as azoles or thiols. Preferably, at least one of benzotriazole (BTA), 1,2,3 triazole, 1,3,4 triazole, 1,2,4 triazole, methyl-thiol-triazole, thiol-triazole, triazole acid, and imidazole are used in the chemical composition. The use of hetero-organic inhibitors as opposed to simple organic compounds is based on the possibility of degradation of organic compounds over time and at extended exposure to certain temperatures. Azoles are organic compounds containing nitrogen atoms with free electron pairs that are potential sites for bonding with metals and that enable inhibiting action. Thiols are organic compounds containing sulfurs atoms with free electron pairs that are potential sites for bonding with copper and that enable inhibiting action. In general, azole compounds are preferred over thiol compounds, as incomplete removal of thiol residues may lead to sulfur atom contamination, a known detriment for many metal structures. Thus, when thiol compounds are used, avoidance of atom residue is very important. Also, there is a possibility of introduction of other heteroatoms beyond the aforementioned N and S such as Se, P, As etc and/or combinations of heteroatoms either in ring incorporation or as side groups in molecules of these compounds so there is a wide range of derivatives that exhibit good inhibition characteristics. Often when additional heteroatoms are used other attributes introduced with the heteroatom must also be considered. For example, it is understood that thiols produce active protection on many metal surfaces; however, thiol use introduces additional considerations of potential negative interactions with metal structures (such as the latent formation of metal sulfides during subsequent processing); and as such, may require additional post processing to remove possible sulfur contamination and thus avoid or minimize the potential for latent metal sulfide formation. As an example: the post processing steps may include one or more of such processes as extended rinse times, specialized or extended post application plasmas, and/or extended vacuum degas processing.

The amount of the metal protectant in the working solution of the present disclosure can be in a range from 10 p.p.m. to 50,000 p.p.m. In one embodiment, the amount of the metal protectant in the working solution can be in a range from 10 p.p.m. to 100 p.p.m. In another embodiment, the amount of the metal protectant in the working solution can be in a range from 100 p.p.m. to 1,000 p.p.m. In yet another embodiment, the amount of the metal protectant in the working solution can be in a range from 1,000 p.p.m. to 10,000 p.p.m. In still another embodiment, the amount of the metal protectant in the working solution can be in a range from 10,000 p.p.m. to 50,000 p.p.m.

According to an embodiment of the present disclosure, formulations for the chemical composition of the working solution can include:
1. 0.1%-20% in weight percentage of an oxidizing agent;
2. 0.14%-14% in weight percentage of a pH stabilizer;
3. 0 p.p.m.-50,000 p.p.m. in weight percentage of at least one metal protectant; and
4. the balance of deionized water or a water-based polar solvent in which water is a predominant portion (more than ½) of the solvent.

An exemplary formulation for the chemical composition of the working solution can be:
1. 9% in weight percentage of an oxidizing agent;
2. 1.4% in weight percentage of a pH stabilizer;
3. 10,000 p.p.m. in weight percentage of at least one metal protectant; and
4. the balance of deionized water or a water-based polar solvent in which water is a predominant portion (more than ½) of the solvent.

According to another embodiment of the present disclosure, formulations for the chemical composition of the working solution can include:
1. 0.1%-20% in weight percentage of an oxidizing agent;
2. 0.14%-1.4% in weight percentage of a pH stabilizer;
3. 1 p.p.m.-100 p.p.m. of a sequestering agent;
4. 0 p.p.m.-50,000 p.p.m. in weight percentage of at least one metal protectant; and
5. the balance of deionized water or a water-based polar solvent in which water is a predominant portion (more than ½) of the solvent.

An exemplary formulation for the chemical composition of the working solution can include:
1. 9% in weight percentage of an oxidizing agent;
2. 1.4% in weight percentage of a pH stabilizer;
3. 10 p.p.m. of a sequestering agent; and
4. 100 p.p.m. in weight percentage of at least one metal protectant; and
5. the balance of deionized water or a water-based polar solvent in which water is a predominant portion (more than ½) of the solvent.

The preferred formulation of the chemical composition is hydrogen peroxide and TEAH in an aqueous solution, wherein the composition has a pH in the range of about 7 to about 9. The chemical composition of the working solution is designed to remove various metallic compounds including, but not limited to, Ti-containing alloys including at least one or carbon and nitrogen and optionally including at least one transition metal and/or at least one lanthanide metal and Ta-containing alloys including at least one or carbon and nitrogen and optionally including at least one transition metal and/or at least one lanthanide metal. As used herein, Ti-containing alloys and Ta-containing alloys refer to various stoichiometric or non-stoichiometric compounds including the various elements within the chemical formulae. In one embodiment, the composition comprises hydrogen peroxide ($H_2O_2$), benzotriazole, tetraethylammonium hydroxide, and de-ionized water, and the composition has a pH in the range of about 7 to about 9.

In one embodiment, a working solution can include a high BTA salt concentration achieved through in-situ reaction of BTA with TEAH. In one embodiment, the working solution can be derived from a stock solution by diluting the stock solution with deionized water and adding an additional oxidizing agent. The stock solution can be obtained by dissolving BTA into a solution of TEAH in water.

In another embodiment, a sequestering agent stock solution may be used to provide the correct concentration of sequestering agent to produce the working solution. This can enable more control in metering the desired level of sequestering agent or sequestering and passivation agents during the formulation of the working solution. In this case a calculation is made where the final desired concentration in the working solution is multiplied by a factor representing an addition amount that can accurately be controlled as defined by a reduction in measurement error of this addition amount. For example: the accuracy of delivering a 10 ppm amount of a sequestering agent in the working solution may be increased by creating a stock solution that is 500× in concentration of sequestering agent; and adding a measure of the stock solution during the production for the working solution that would result in the desired final concentration of sequestering agent in the working solution. If such a stock solution were employed during the production of a working solution, a volume addition of stock solution that supplied sufficient sequestering agent and/or passivation agent would be added during this production such that it would result in the desired concentration in the working solution.

We have found that the addition of 5 grams of CDTA added with stirring to a 300 ml solution consisting of 20 mls of 35% TEAH dissolved in 300 mls of deionized water dissolves rapidly. Once these 5 grams of CDTA have fully dissolved into the TEAH-Deionized water solution, the volume is adjusted to 1 liter producing an approximate 5000 ppm stock solution. Of CDTA in TEAH aqueous mixture. Likewise, CDTA could be added to a BTA-TEAH Stock solution during the production of a BTA-TEAH stock solution to produce a CDTA, BTA-TEAH stock solution.

According to an embodiment of the present disclosure, formulations for the chemical composition of the stock solution can include:
1. 0 p.p.m.-400,000 p.p.m. in weight percentage of at least one metal protectant;
2. 5%-35% (preferably 5%-35% in weight percentage) of a pH stabilizer; and
3. the balance of an aqueous solution (i.e., deionized water or a water-based polar solvent in which water is a predominant portion (more than ½) of the solvent).

An exemplary formulation for the chemical composition of the stock solution can be:
1. 250,000 p.p.m. in weight percentage of at least one metal protectant;
2. 28% in weight percentage of a pH stabilizer; and
3. the balance of deionized water or a water-based polar solvent in which water is a predominant portion (more than ½) of the solvent.

According to another embodiment of the present disclosure, formulations for the chemical composition of the stock solution can include:
1. at least one sequestering agent at a concentration in a range from 200 p.p.m. to 20,000 p.p.m. in weight percentage
2. 5%-35% (preferably 5%-35% in weight percentage) of a pH stabilizer; and
3. the balance of an aqueous solution (i.e., deionized water or a water-based polar solvent in which water is a predominant portion (more than ½) of the solvent).

An exemplary formulation for the chemical composition of the stock solution can be:
1. 2,000 p.p.m. in weight percentage of a sequestering agent;
2. 28% in weight percentage of a pH stabilizer; and
3. the balance of deionized water or a water-based polar solvent in which water is a predominant portion (more than ½) of the solvent.

According to yet another embodiment of the present disclosure, formulations for the chemical composition of the stock solution can include:
1. 0 p.p.m.-400,000 p.p.m. in weight percentage of at least one metal protectant;
2. 2%-35% (preferably 5%-35%) in weight percentage of a pH stabilizer;
3. 200 p.p.m.-20,000 p.p.m. of a sequestering agent; and
4. an aqueous solution (i.e., the balance of deionized water or a water-based polar solvent in which water is a predominant portion (more than ½) of the solvent).

An exemplary formulation for the chemical composition of the stock solution can include:
1. 100000 p.p.m. in weight percentage of at least one metal protectant;
2. 28% in weight percentage of a pH stabilizer;
3. 5000 p.p.m. of a sequestering agent; and
4. the balance of deionized water or a water-based polar solvent in which water is a predominant portion (more than ½) of the solvent.

In an illustrative example, 100 grams of BTA can be dissolved into 0.4 liter of a solution including 35% in weight of TEAH and balance deionized water ("35% TEAH solution" hereafter). Vigorous stirring may be employed to dissolve 250 grams of BTA into the 35% TEAH solution to generate an undiluted BTA and TEAH containing solution ("undiluted solution" hereafter). This results in a solution volume expansion to about 0.8 liters. After the addition of 5 grams of CDTA to this BTA and TEAH containing solution, sufficient deionized water (about 0.2 liters) is added to bring the total volume of the diluted solution to 1.0 liter, which is the stock solution. This stock solution includes 10% weight percentage of BTA and 0.5% by weight CDTA, i.e., 100,000 p.p.m. of BTA and 5000 p.p.m. CDTA.

The working solution including any of the chemical compositions described above can be applied to a microelectronic device in multiple ways. The chemical compositions of the present disclosure provide different relative etch rates among metallic compounds than previously known etchants such as the SC1 solution. As used herein, the SC1 refers to a solution including NH4OH (ammonium hydroxide), H2O2 (hydrogen peroxide), and H2O (water).

The etch rate of the solution including the chemical composition described above for TiN and TiC (referred to as "T-etch" formulations) is compared with the etch rates of various SC1 solutions at different temperatures in Table 1. The ratios in parentheses in the name of the SC1 formulations refer to the ratios among $H_2O:H_2O_2:NH_4OH$.

TABLE 1

Comparison of etch properties of the T-etch formulations and SC1 formulations

| Formulation | T (° C.) | pH (at 20 ° C.) | Etch rate for TiN (nm/min) | Etch rate for TiC (nm/min) | Etch rate ratio between TiN and TiC |
|---|---|---|---|---|---|
| SC1 (25:1.5:1) | 40 | 10.5 | 3.4 | 25.2 | 0.13 |
| SC1 (50:1.5:1) | 50 | 10.5 | 4.7 | 25.8 | 0.18 |
| SC1 (100:1.5:1) | 50 | 10.5 | 2.0 | 16.6 | 0.18 |
| SC1 (84:20:1) | 40 | 9.6 | 7.4 | 16.0 | 0.46 |
| T-etch pH 9.5 | 40 | 9.5 | 3.4 | 1.7 | 1.99 |
| T-etch pH 9.5 | 50 | 9.5 | 7.3 | 3.5 | 2.04 |
| T-etch pH 9.0 | 50 | 9 | 7.1 | 4.1 | 1.76 |

Table 1 illustrates that the T-etch solution provides different etch characteristics than SC1 solutions that are typically employed to remove metallic materials in the art. Specifically, the SC1 solutions etch TiC faster than TiN by a factor of at least 2, while the T-etch solutions etch TiN faster than TiC by a factor in a range from 1.76 to 2.04.

FIG. 1 shows a comparison of etch rates for a T-etch solution having a pH of 9.0, including 100 p.p.m. of CDTA, and at a temperature of 40° C. with etch rates for an SC1 solution including 50:1.5:1 of $H_2O:H_2O_2:NH_4OH$ and at a temperature of 40° C. for various metallic materials including TiN, a nitride of a Ti alloy #1, a nitride of a Ti alloy #2, TiC, Ti alloy #1, Ta alloy #2, and Ti alloy #2. The absolute etch rate and etch selectivity of the T-etch solution depends on the composition of the various alloys.

The distinct etch characteristics of the chemical composition of the present disclosure can be employed alone, or in combination with another etchant such as an SC1 solution, to etch selectively, or non-selectively, at least one material selected from conductive metallic nitrides, conductive metallic carbides, elemental metals, and intermetallic alloys of at least two elemental metals from patterned or unpatterned structures (such as gate cavities) on a semiconductor substrate. In one embodiment, the at least one metallic material can include at least one material selected from Ti-containing alloys including at least one or carbon and nitrogen and optionally including at least one transition metal and/or at least one lanthanide metal and Ta-containing alloys including at least one of carbon and nitrogen and optionally including at least one transition metal and/or at least one lanthanide metal. Other transition and lanthanide metals, metal carbides, and metal nitrides may also be used to control the desired work function properties. The chemical composition of the present disclosure is believed to be usable to etch any work function metal known in the art. It is understood that the effectiveness and etch rate of the chemical composition of the present disclosure would vary depending on the species of the work function metal.

In one embodiment, the at least one metallic material can be a plurality of metallic materials that include a first metallic material and a second metallic material, and an SC1 etch chemistry can provide an etch selectivity that is greater than 1 for the second metallic material relative to the first metallic material (i.e., etch the second metallic material faster than the first metallic material), and the chemical composition of the present disclosure provides an etch selectivity that is less than 1 for the second metallic material relative to the first metallic material (i.e., etch the first metallic material faster than the second metallic material). As used herein, an "etch selectivity" of an etchant solution for a first material relative to a second material refers to the ratio of the etch rate of the first material in the etchant solution to the etch rate of the second material in the etchant solution. In an illustrative example, the first metallic material can be TiN, and the second metallic material can be selected from Ti-containing alloys including at least one or carbon and nitrogen and optionally including at least one transition metal and/or at least one lanthanide metal and Ta-containing alloys including at least one or carbon and nitrogen and optionally including at least one transition metal and/or at least one lanthanide metal.

In one embodiment, the at least one metallic material can be a plurality of metallic materials that include a first metallic material and a second metallic material, and the chemical composition can provide a greater etch rate for the first metallic material than an SC1 etch chemistry, and the chemical composition can provide a lesser etch rate for the second metallic material than the SC1 etch chemistry. In an illustrative example, the first metallic material can be TiN, and the second metallic material can be selected from a Ti-containing alloy including at least one or carbon and nitrogen and optionally including at least one transition metal and/or at least one lanthanide metal, and a Ta-containing alloy including at least one or carbon and nitrogen and optionally including at least one transition metal and/or at least one lanthanide metal.

Application of the chemical composition of the present disclosure in wet etch processes for removing at least one metallic material is herein illustrated employing various exemplary semiconductor structures.

Referring to FIG. 2, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-on-insulator (SOI) substrate (not shown) containing a top semiconductor layer, a buried insulator layer located under the top semiconductor layer, and a bottom semiconductor layer located under the buried insulator layer.

Various portions of the semiconductor material in the semiconductor substrate 8 can be doped with electrical dopants of n-type or p-type at different dopant concentration levels. For example, the semiconductor substrate 8 may include a semiconductor material layer 10. The semiconductor material layer may include a doped well (not shown) as needed.

A disposable gate material layer is deposited and lithographically patterned to form disposable gate structures. After various processing steps known in the art for replacement gate processing schemes, a planarization dielectric layer 60 is deposited over the disposable gate structures. Preferably, the planarization dielectric layer 60 is a dielectric material that may be easily planarized. For example, the planarization dielectric layer 60 can be a doped silicate glass or an undoped silicate glass (silicon oxide). The planarization dielectric layer 60 is planarized employing the disposable gate structures as stopping structures. The top surface 63 of the planarization dielectric layer 60 can be substantially horizontal after planarization. The disposable gate structures are removed selective to the planarization dielectric layer 60 to form gate cavities 25, one of which is illustrated in FIG. 2.

Referring to FIG. 3, an interfacial dielectric layer 31 can be optionally formed on the exposed surface of the semiconductor material layer 10 by conversion of the exposed semiconductor material into a dielectric material. The formation of the interfacial dielectric layer 32 can be effected by thermal conversion or plasma treatment. A gate dielectric layer 32L is deposited in the gate cavity 25 and over the planarization dielectric layer 32L. The gate dielectric layer 32L can be deposited as a contiguous gate dielectric layer that contiguously covers all top surfaces of the planarization dielectric layer 60, all sidewall surfaces of the gate cavity 25, and the top surface of the interfacial dielectric layer 31.

The gate dielectric layer 32L can be a high dielectric constant (high-k) material layer having a dielectric constant greater than 3.9. The gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc.

Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 32L, as measured at horizontal portions, can be from 0.9 nm to 6 nm, and from 1.0 nm to 3 nm. The gate dielectric layer 32L may have an effective oxide thickness on the order of or less than 2 nm. In one embodiment, the gate dielectric layer 32L is a hafnium oxide ($HfO_2$) layer.

Figure 4:
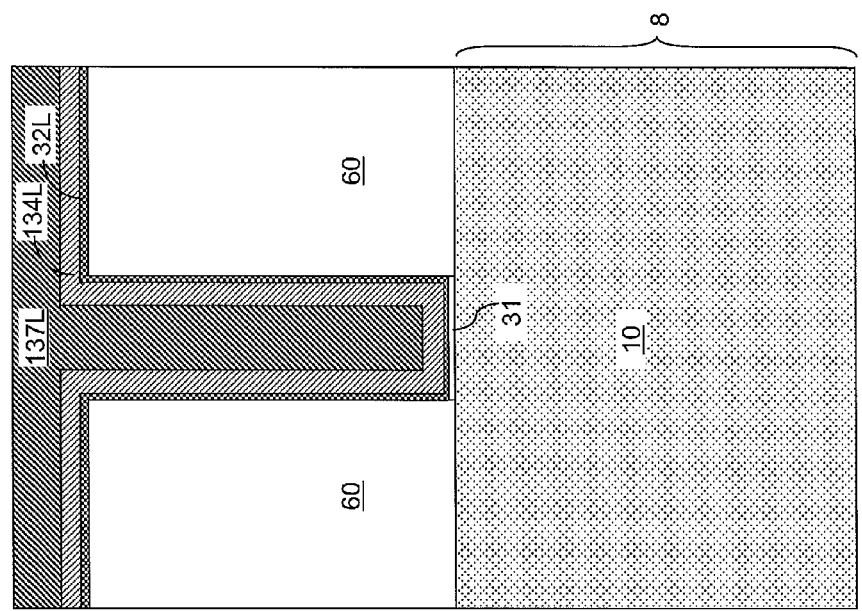
FIG. 4 is a vertical cross-sectional view of the first exemplary semiconductor structure after formation of a work function material layer and a conductive material layer according to the first embodiment of the present disclosure

Referring to FIG. 4, a work function material layer 134L is deposited within the gate cavity 25. The work function material layer 134L includes a metallic material that controls the work function of a field effect transistor to be subsequently formed. The first work function material layer 34L can include p-type work function materials as known in the art, or n-type work function materials as known in the art. In one embodiment, the work function material layer 134L includes a metallic material that adheres to the gate dielectric layer 32L without delamination. In one embodiment, the work function material layer 134L can be a TiN layer or a TiN alloy layer. The work function material layer 134L can be deposited by physical vapor deposition (PVD), atomic layer deposition (ALD), and/or chemical vapor deposition (CVD). The thickness of the work function material layer 134L, as measured at a horizontal portion above the interfacial dielectric layer 31 can be, for example, from 3 nm to 20 nm, although lesser and greater thicknesses can also be employed.

A conductive fill material layer 137L is subsequently deposited to fill the gate cavity 25. The conductive fill material layer 137L can include an elemental metal, an alloy of at least two elemental metals, a metallic nitride material, a metallic carbide material, or a combination thereof. The conductive fill material layer 137L can be deposited by physical vapor deposition (PVD), atomic layer deposition (ALD), and/or chemical vapor deposition (CVD).

Figure 5:
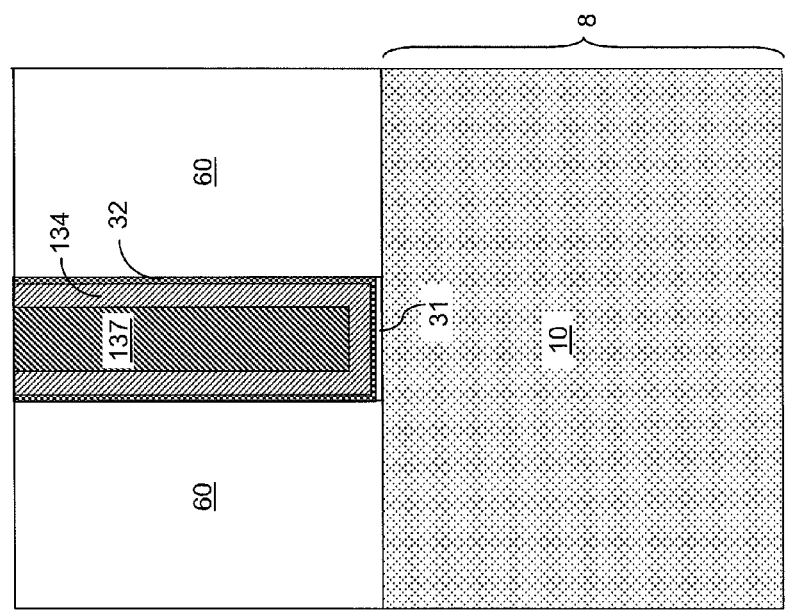
FIG. 5 is a vertical cross-sectional view of the first exemplary semiconductor structure after planarization of the conductive material layer, the work function material layer, and the gate dielectric layer according to the first embodiment of the present disclosure.

Referring to FIG. 5, a replacement gate structure is formed in the gate cavity 25 (See FIG. 2) by removing portions of the conductive fill material layer 137L, the work function material layer 134L, and the gate dielectric layer 32L from above the top surface of the planarization dielectric layer 60, for example, by chemical mechanical planarization (CMP). The replacement gate structure includes a gate dielectric (31, 32), which includes the interfacial dielectric layer 31 and a U-shaped gate dielectric 32, which is a remaining portion of the gate dielectric layer 32L. The replacement gate structure further includes a gate electrode (134, 137). The gate electrode (134, 137) includes a work function material portion 134 and a conductive fill material portion 137. The work function material portion 134 is a remaining portion of the work function material layer 134, and the conductive fill material portion 137 is a remaining portion of the conductive fill material layer 137L.

Figure 6:
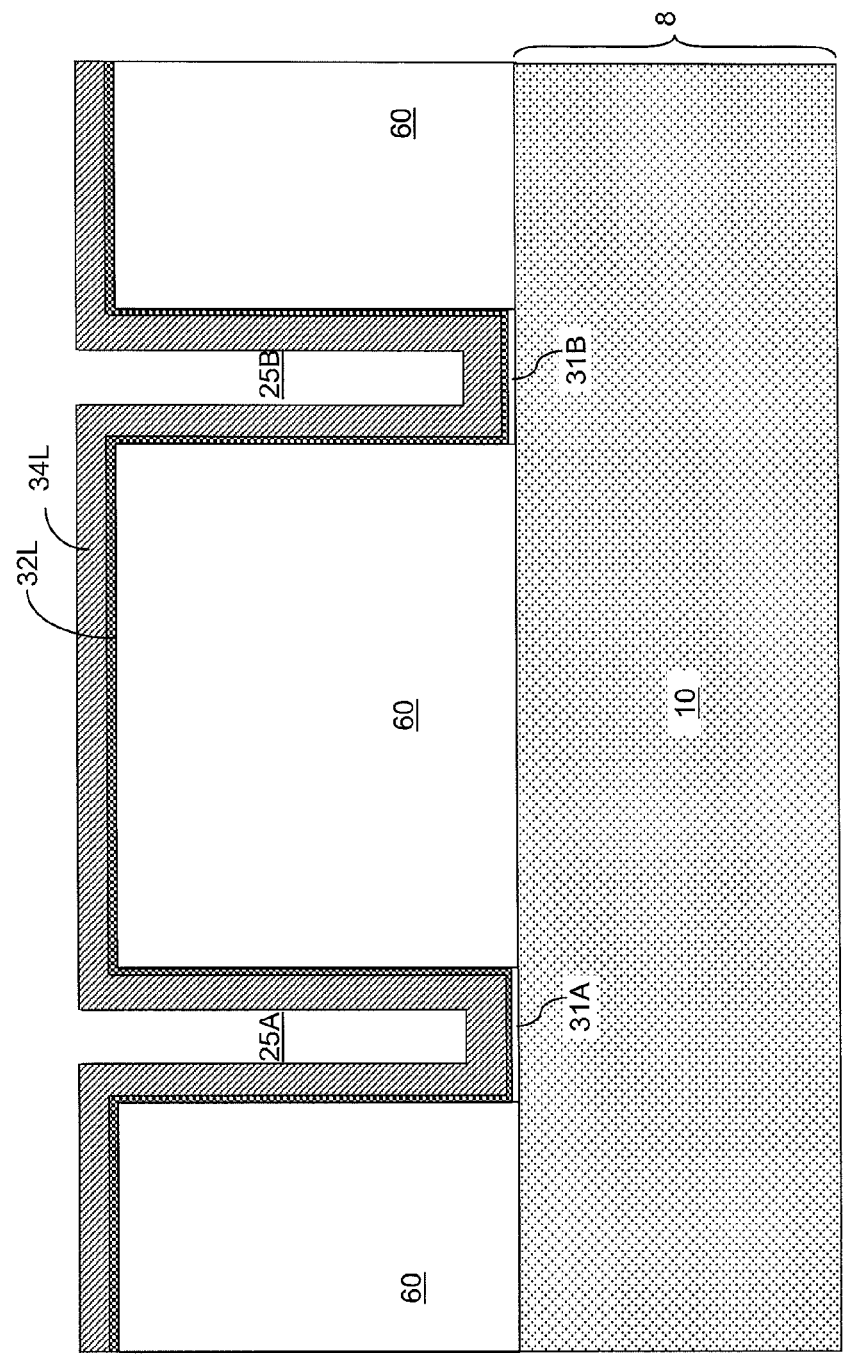
FIG. 6 is a vertical cross-sectional view of a second exemplary semiconductor structure after formation of a gate dielectric layer and a first work function material layer according to a second embodiment of the present disclosure FIG. 7 a vertical cross-sectional view of the second exemplary semiconductor structure after thinning of the first work function material layer employing a patterned photoresist layer according to the second embodiment of the present disclosure.

Referring to FIG. 6, a second exemplary semiconductor structure according to a second embodiment of the present disclosure can be derived from a variation of the first exemplary semiconductor structure of FIG. 2 in which multiple gate cavities are formed. The gate cavities can include, for example, a first gate cavity 25A and a second gate cavity 25B. A first interfacial dielectric layer 31A and a second interfacial dielectric layer 31B can be formed at the bottom surfaces of the first and second gate cavities (25A, 25B), respectively, in the same manner as in formation of the interfacial dielectric layer 31 in FIG. 3. A gate dielectric layer 32L can be formed in the same manner as in the first embodiment.

A first work function material layer 34L is deposited within the first gate cavity 25A and the second gate cavity 25B. The first work function material layer 34L includes a metallic material that controls the work function of a first field effect transistor to be subsequently formed in a region underlying the first gate cavity 25A. The first work function material layer 34L can include p-type work function materials as known in the art, or n-type work function materials as known in the art. In one embodiment, the first work function material layer 34L includes a metallic material that adheres to the gate dielectric layer 32L without delamination. In one embodiment, the first work function material layer 34L can be a TiN layer. The first work function material layer 34L can be deposited by physical vapor deposition (PVD), atomic layer deposition (ALD), and/or chemical vapor deposition (CVD). The thickness of the first work function material layer 34L, as measured at a horizontal portion above the first or second interfacial dielectric layer (31A, 31B) can be, for example, from 3 nm to 20 nm, although lesser and greater thicknesses can also be employed.

Figure 7:
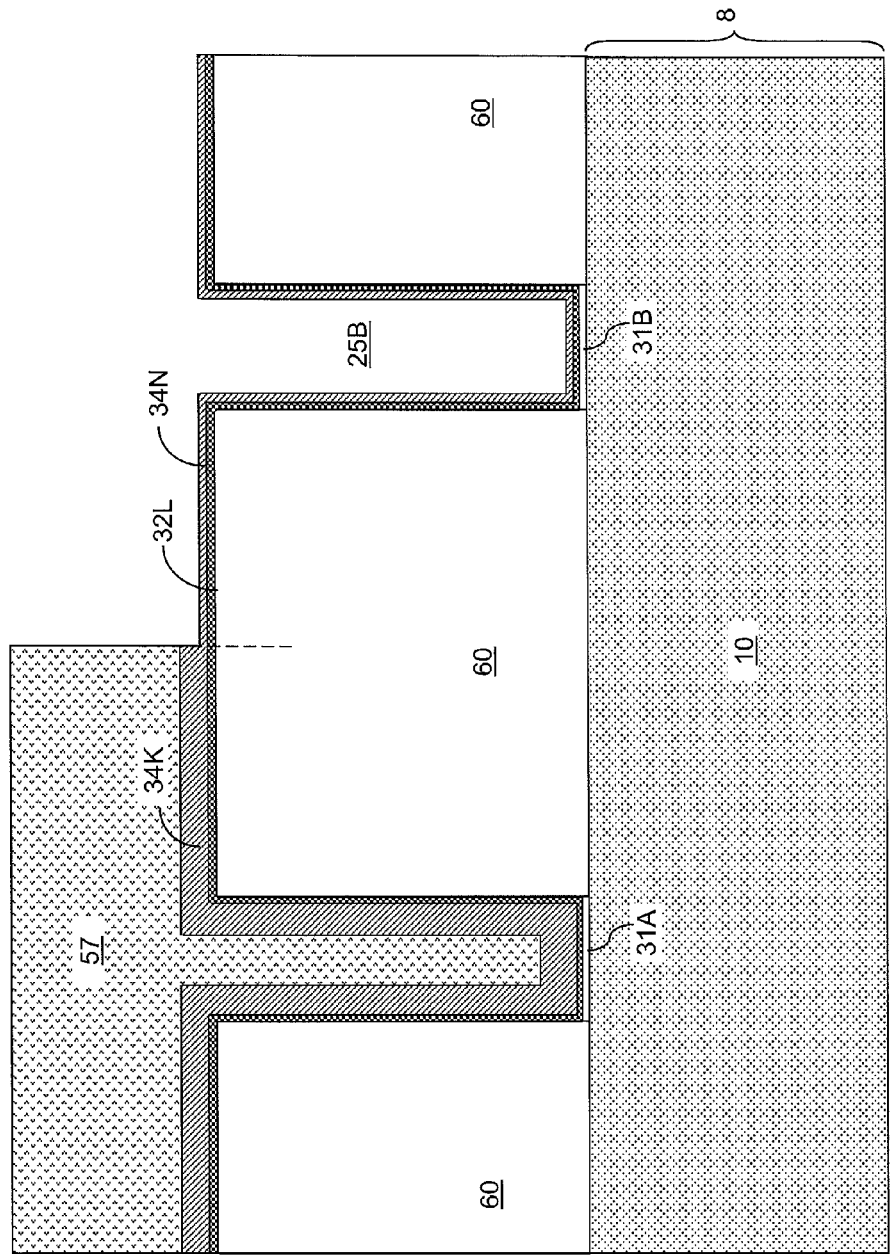

Referring to FIG. 7, a photoresist material layer 57 including a photoresist material is applied in the gate cavities (25A, 25B) and over the planarization dielectric layer 60, for example, by spin coating, and is lithographically patterned such that a portion of the photoresist material fills the first gate cavity 25A, and the photoresist material is not preset in the second gate cavity 25B. The portion of the first work function material layer 34L in the second gate cavity 25B and a vicinity thereof can be thinned or removed by an isotropic etch. In one embodiment, the isotropic etch can employ a solution including the chemical composition of the present disclosure. In another embodiment, the isotropic etch can employ an etchant known in the art such as an SC1 solution. In yet another embodiment, the isotropic etch can be a multistep process in which a solution including the chemical composition of the present disclosure is employed in one of the steps and a conventional etch solution such as an SC1 solution is employed in another of the steps.

In one embodiment, the portion of the first work function material layer 34L in the second gate cavity 25B and a vicinity thereof can be thinned to form a thinned first work function material 34N. The thickness of the thinned first work function material layer 34N can be selected such that the work function of a gate electrode to be subsequently formed in the second gate cavity 25B is affected significantly by another metallic material to be deposited on the thinned first work function material layer 34N. In one embodiment, the thickness of the thinned first work function material layer 34N can be in a range from 0.5 nm to 3.0 nm, although lesser and greater thicknesses can also be employed. The portion of the first work function material layer 34L that is covered by the photoresist material layer 57 is herein referred to as an unthinned first work function material layer 34K. The photoresist material layer 57 is subsequently removed, for example, by ashing.

Figure 8:
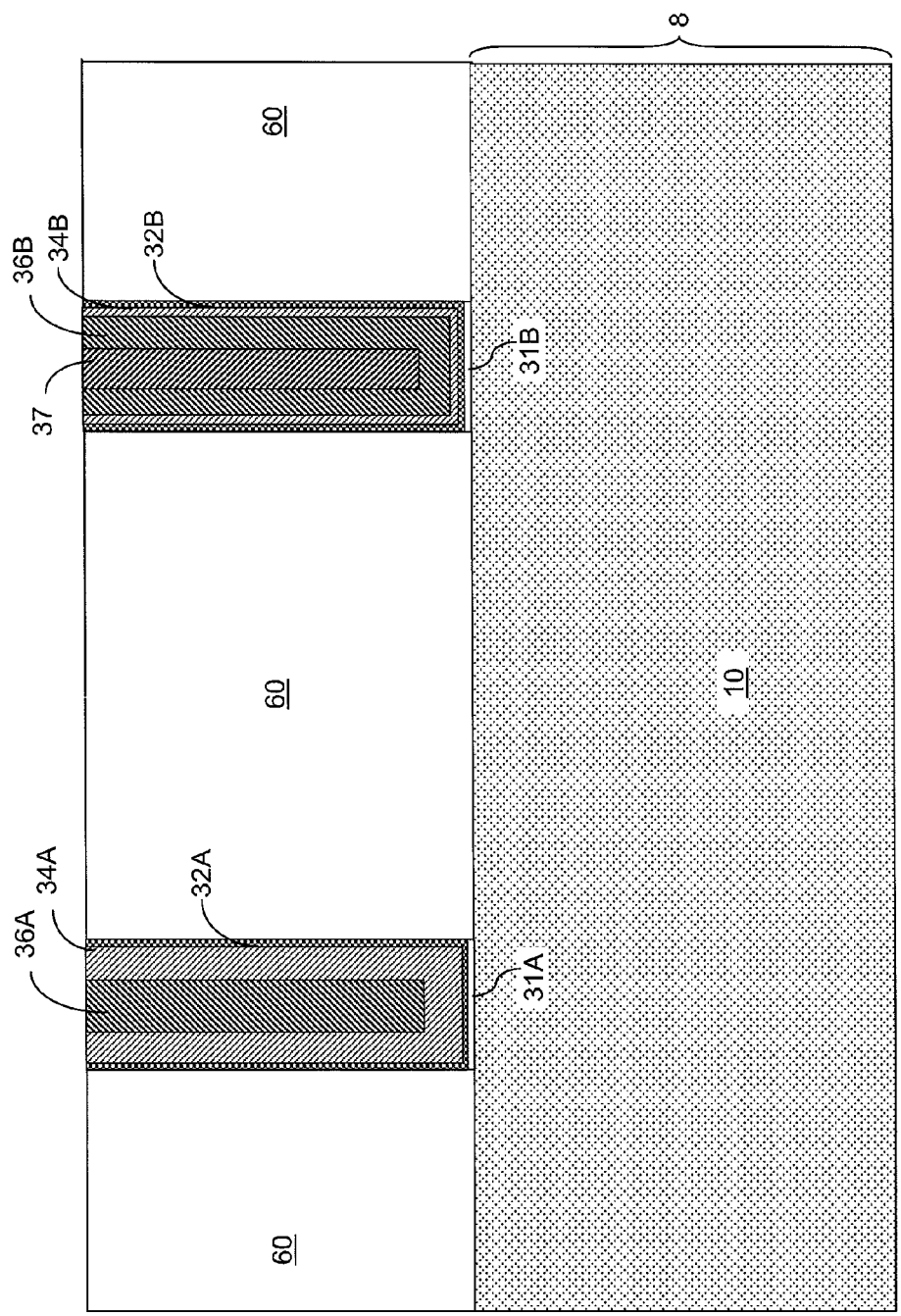
FIG. 8 is a vertical cross-sectional view of the second exemplary semiconductor structure after deposition of a second work function material layer, a conductive fill material layer, and planarization of the conductive fill material layer, the second work function material layer, the first work function material layer, and the gate dielectric layer according to the second embodiment of the present disclosure.

Referring to FIG. 8, a second work function material layer and a conductive fill material layer are deposited within the first gate cavity 25A and the second gate cavity 25B. The second work function material layer includes a metallic material that controls the work function of a second field effect transistor to be subsequently formed underneath the second interfacial dielectric layer 31B. The second work function material layer can include p-type work function materials as known in the art, or n-type work function materials as known in the art. In one embodiment, if the thinned first work function material layer 34N includes a metallic material that adheres to the gate dielectric layer 32L without delamination, the metallic material of the second work function material may be selected without consideration for adhesion to the dielectric material layer 32L. In one embodiment, the second conductive fill material layer may completely fill the first gate cavity 25A and does not completely fill the second gate cavity 25B, and the conductive fill material layer may completely fill the second gate cavity 25B.

The conductive fill material layer, the second work function material layer, the unthinned first work function material layer 34K, and the thinned first work function material layer 34N are removed from above the top surface of the planarization dielectric layer 60 by planarization, which can be, for example, chemical mechanical planarization (CMP). A remaining portion of the unthinned first work function material layer 34K filling the first gate cavity 25A constitutes a first-device first work function material portion 34A, a remaining portion of the thinned first work function material layer 34N filling the second gate cavity 25B constitutes a second-device first work function material portion 34B, a remaining portion of the second work function material layer filling the first gate cavity 25A constitutes a first-device second work function material portion 36A, a remaining portion of the second work function material layer filling the second gate cavity 25B constitutes a second-device second work function material portion 36B, and a remaining portion of the conductive fill material layer filling the second gate cavity 25B constitutes a conductive fill material portion 37. A remaining portion of the gate dielectric layer 32L in the first gate cavity 25A is the first gate dielectric 32A, and a remaining portion of the gate dielectric layer 32L in the second gate cavity 25B is the second gate dielectric 32B. The first and second gate dielectrics (32A, 32B) are U-shaped gate dielectrics, each including a horizontal portion and vertical portions.

In one embodiment, the second work function material layer can be a TiC layer or a TiC alloy layer. In this case, the first-device second work function material portion 36A and the second-device second work function material portion 36B can be TiC portions or TiC alloy portions. The conducive fill material layer can be a metallic nitride layer or a metallic carbide layer. In one embodiment, conductive fill material layer and the conductive fill material portion 37 can include TiN or TiN alloys. Each of the second work function material layer and the conductive fill material layer can be deposited by physical vapor deposition (PVD), atomic layer deposition (ALD), and/or chemical vapor deposition (CVD). The thickness of the second work function material layer, as measured on sidewall surfaces of the second gate dielectric 32B can be, for example, from 3 nm to 20 nm, although lesser and greater thicknesses can also be employed.

Figure 9:
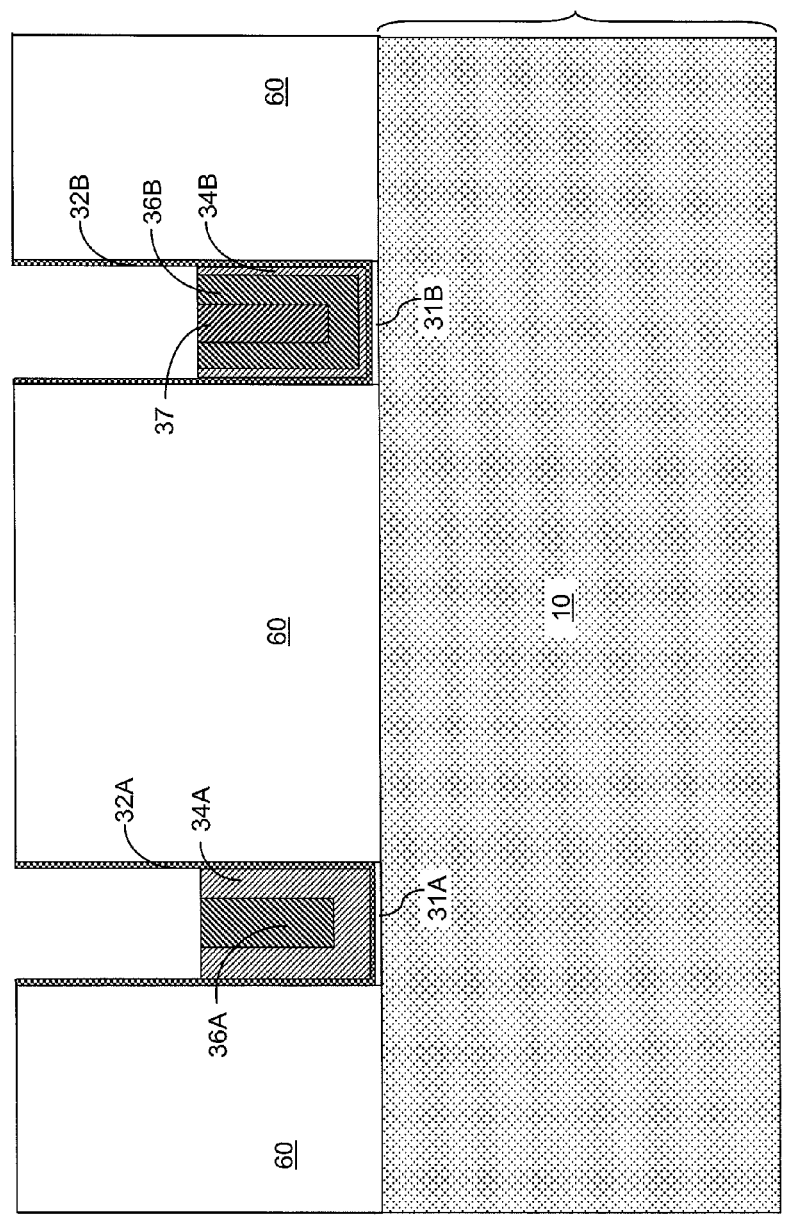
FIG. 9 is a vertical cross-sectional view of the second exemplary semiconductor structure after recessing of metallic materials in the gate cavities according to the second embodiment of the present disclosure.

Referring to FIG. 9, a recess etch is performed to remove upper portions of the first-device first work function material portion 34A and the first-device second work function material portion 36A to form a cavity, and to remove upper portions of the second-device first work function material portion 34B, the second-device second work function material portion 36B, and the conductive fill material portion 37 to form another cavity. In one embodiment, an isotropic etch process can be employed for the recess etch. In one embodiment, the isotropic etch process can employ a solution including the chemical composition of the present disclosure. In another embodiment, the isotropic etch process can employ an etchant known in the art such as an SC1 solution. In yet another embodiment, the isotropic etch process can be a multistep process in which a solution including the chemical composition of the present disclosure is employed in one of the steps and a conventional etch solution such as an SC1 solution is employed in another of the steps.

In one embodiment, the chemical formulation of the present disclosure can be employed to simultaneously recess the various materials of the first-device first work function material portion 34A, the first-device second work function material portion 36A, the second-device first work function material portion 34B, the second-device second work function material portion 36B, and the conductive fill material portion 37 to similar heights in a single wet etch process. In this case, a single etch process can be sufficient to recess various metallic portions to similar heights. In another embodiment, the chemical formulation of the present disclosure can be employed to simultaneously recess the various materials of the first-device first work function material portion 34A, the first-device second work function material portion 36A, the second-device first work function material portion 34B, the second-device second work function material portion 36B, and the conductive fill material portion 37 to similar heights in combination with another chemical formation such as a SC1 solution.

Figure 10:
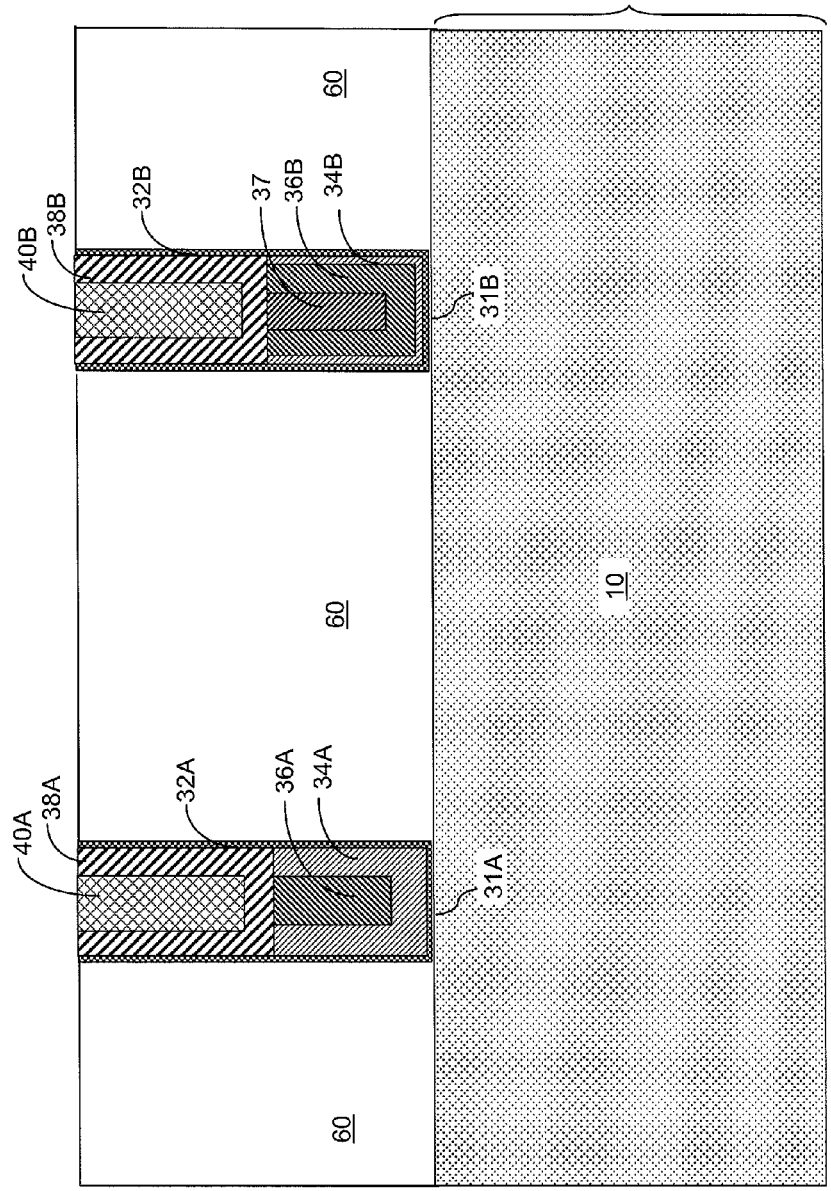
FIG. 10 is a vertical cross-sectional view of the second exemplary semiconductor structure after formation of outer conductive material portions and inner conductive material portions according to the second embodiment of the present disclosure.

Referring to FIG. 10, an outer conductive material layer and an inner conductive material layer can be sequentially deposited in the first and second gate cavities (25A, 25B). The first and second gate cavities (25A, 25B) are filled with the outer conductive material layer and the inner conductive material layer. In one embodiment, the outer conductive material layer can include a metallic nitride material that can function as a diffusion barrier for gaseous impurities such as oxygen and moisture. For example, the outer conductive material layer can include TiN, TaN, WN, or a combination thereof. In one embodiment, the inner conductive material layer can include an elemental metal or an intermetallic alloy of at least two elemental metals having high conductivity. For example, the inner conductive material layer can include W, Al, or an alloy of W and Al.

The outer conductive material layer and the inner conductive material layer are removed from above the top surface of the planarization dielectric layer, for example, by chemical mechanical planarization (CMP). The remaining portion of the outer conductive material layer filling the first gate cavity 25A is herein referred to as a first-device outer conductive material portion 38A. The remaining portion of the inner conductive material layer filling the first gate cavity 25A is herein referred to as a first-device inner conductive material portion 40A. The remaining portion of the outer conductive material layer filling the second gate cavity 25B is herein referred to as a second-device outer conductive material portion 38B. The remaining portion of the inner conductive material layer filling the second gate cavity 25A is herein referred to as a second-device inner conductive material portion 40B.

Figure 11:
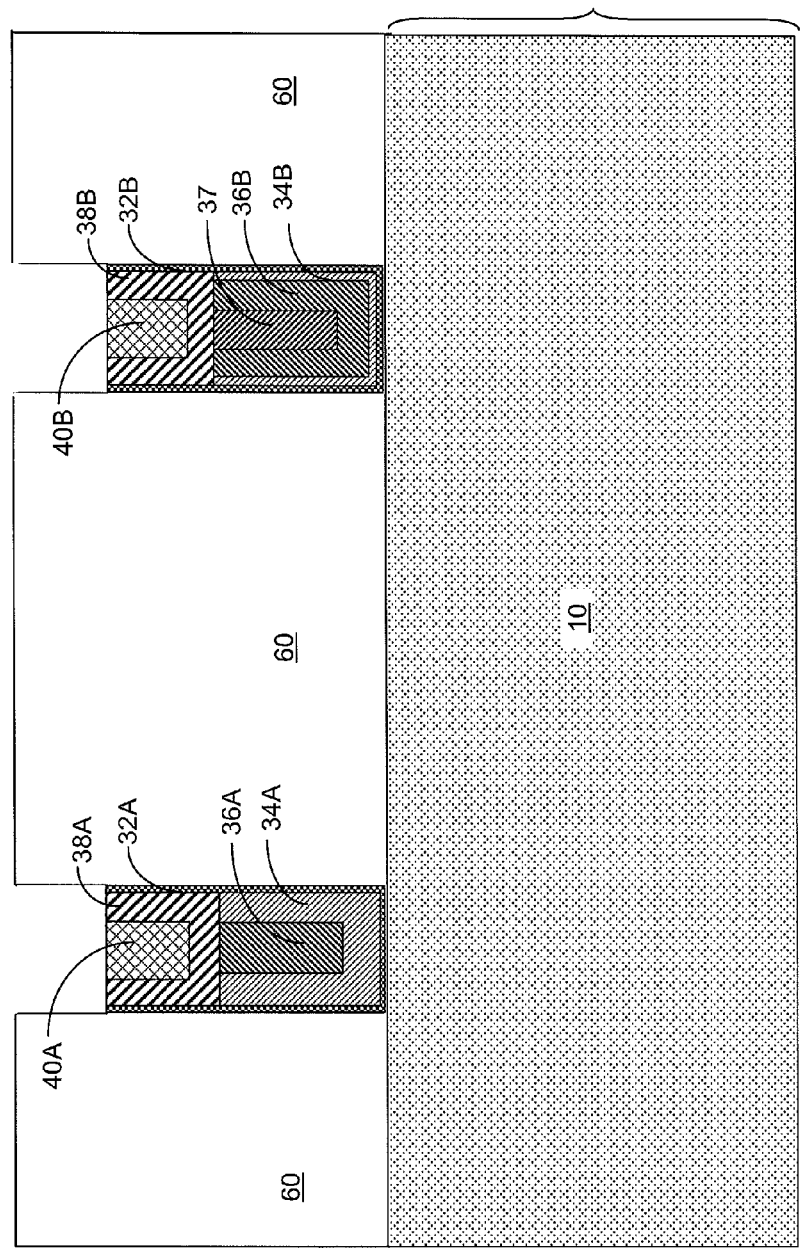
FIG. 11 is a vertical cross-sectional view of the second exemplary semiconductor structure after recessing of the outer conductive material portions and the inner conductive material portions according to the second embodiment of the present disclosure.

Referring to FIG. 11, the materials of the inner conductive material portions (40A, 40B) and the outer conductive material portions (38A, 38B) can be etched isotropically or anisotropically. In one embodiment, an isotropic etch can be performed to recess the inner conductive material portions (40A, 40B) and the outer conductive material portions (38A, 38B). The isotropic etch can employ a solution including the chemical composition of the present disclosure. The solution of the chemical composition of the present disclosure can etch elemental metallic materials or intermetallic alloys of at least two elemental metals at a higher etch rate than a metallic nitride.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a microelectronic device comprising:
    forming at least one cavity in a dielectric material layer over a semiconductor substrate;
    forming a gate dielectric along sidewalls and a bottom surface of said at least one cavity;
    depositing at least one metallic material within said at least one cavity and on said gate dielectric; and
    removing a portion of said at least one metallic material by an etch process employing a chemical composition, wherein said chemical composition comprises:
    an aqueous solution;

a pH stabilizer selected from quaternary ammonium salts and quaternary ammonium alkali; and an oxidizing agent selected from peroxides and oxidants.

2. The method of claim 1, wherein said pH stabilizer is tetraethylammonium hydroxide (TEAH).

3. The method of claim 1, wherein said oxidizing agent comprises at least one of hydrogen peroxide ($H_2O_2$) and benzoyl peroxide ($C_{12}H_{10}O_4$).

4. The method of claim 1, wherein said aqueous solution comprises de-ionized water.

5. The method of claim 1, wherein said composition comprises hydrogen peroxide ($H_2O_2$), benzotriazole, tetraethylammonium hydroxide, and de-ionized water and wherein said composition has a pH in the range of about 7 to about 9.

6. The method of claim 1, wherein said chemical composition further comprises at least one metal protectant.

7. The method of claim 6, wherein said metal protectant is at least one of benzotriazole, 1,2,3 triazole, 1,3,4 triazole, 1,2,4 triazole and imidazole, methyl-thiol-triazole, thiol-triazole, and triazole acid.

8. The method of claim 1, wherein said chemical composition further comprises a sequestering agent selected from amines and amino acids.

9. The method of claim 8, wherein the sequestering agent is at least one of 1,2-cyclohexanediamine-N, N, N',N'-tetraacetic acid (CDTA), ethyenediaminetetraacetic acid (EDTA) and diethylenetriaaminopentaacetic acid (DTPA).

10. The method of claim 1, wherein said chemical composition is applied to said portion of said at least one metallic material by a wet etch for a duration in a range from about 1 minute to about 5 minutes and at a temperature in the range of about 25° C. to about 80° C.

11. The method of claim 1, wherein said forming of said at least one cavity in said dielectric material layer comprises:
   forming at least one disposable structure over said semiconductor substrate;
   depositing said dielectric material layer over said at least one disposable structure;
   planarizing said dielectric material layer, wherein a top surface of each of said at least one disposable structure is physically exposed; and
   removing said at least one disposable structure selective to said dielectric material layer.

12. The method of claim 1, further comprising forming a source region, a drain region, and a body region of a field effect transistor in said semiconductor substrate, wherein one of said at least one cavity overlies said body region.

13. The method of claim 1, wherein said at least one metallic material comprises at least one material selected from conductive metallic nitrides, conductive metallic carbides, elemental metals, and intermetallic alloys of at least two elemental metals.

14. The method of claim 1, wherein said at least one metallic material comprises at least one material selected from Ti-containing alloys including at least one of carbon and nitrogen and optionally including at least one transition metal and/or at least one lanthanide metal.

15. The method of claim 1, wherein said at least one metallic material comprises a first metallic material and a second metallic material, and an SC1 etch chemistry provides an etch selectivity that is greater than 1 for said second metallic material relative to said first metallic material, and said chemical composition provides an etch selectivity that is less than 1 for said second metallic material relative to said first metallic material.

16. The method of claim 15, wherein said first metallic material is TiN, and said second metallic material is selected from Ti-containing alloys including at least one or carbon and nitrogen and optionally including at least one transition metal and/or at least one lanthanide metal and Ta-containing alloys including at least one or carbon and nitrogen and optionally including at least one transition metal and/or at least one lanthanide metal.

17. The method of claim 1, wherein said at least one metallic material comprises a first metallic material and a second metallic material, and said chemical composition provides a greater etch rate for said first metallic material than an SC1 etch chemistry, and said chemical composition provides a lesser etch rate for said second metallic material than said SC1 etch chemistry.

18. The method of claim 1, wherein said at least one cavity includes a first cavity and a second cavity, and said method further comprises;
   filling one of said first and second cavities with a photoresist material, wherein said photoresist material is not present in another of said first and second cavities; and
   removing a portion of said at least one metallic material from within said another of said first and second cavities, while said photoresist material protects another portion of said at least one metallic material within said one of said first and second cavities.

19. The method of claim 18, wherein yet another portion of said at least one metallic material having a thickness that is less than a thickness of said another portion of said at least one metallic material is present within said another of said first and second cavities after said etch process.

* * * * *